US012225836B2

(12) United States Patent
Zhang et al.

(10) Patent No.: US 12,225,836 B2
(45) Date of Patent: Feb. 11, 2025

(54) PHASE CHANGE THERMAL STORAGE CERAMIC AND PREPARATION METHOD THEREOF

(71) Applicant: Wuhan University of Science and Technology, Wuhan (CN)

(72) Inventors: Meijie Zhang, Wuhan (CN); Cangjuan Han, Wuhan (CN); Huazhi Gu, Wuhan (CN); Ao Huang, Wuhan (CN); Lvping Fu, Wuhan (CN)

(73) Assignee: Wuhan University of Science and Technology, Wuhan (CN)

( * ) Notice: Subject to any disclaimer, the term of this patent is extended or adjusted under 35 U.S.C. 154(b) by 1045 days.

(21) Appl. No.: 17/167,225

(22) Filed: Feb. 4, 2021

(65) Prior Publication Data

US 2021/0384426 A1 Dec. 9, 2021

(30) Foreign Application Priority Data

Jun. 5, 2020 (CN) ........................ 202010507246.3

(51) Int. Cl.
*H10N 70/00* (2023.01)
*H10N 60/01* (2023.01)

(52) U.S. Cl.
CPC ....... *H10N 70/884* (2023.02); *H10N 60/0296* (2023.02); *H10N 70/011* (2023.02)

(58) Field of Classification Search
CPC ............. H10N 70/884; H10N 60/0296; H10N 70/011; B22F 1/145; B22F 3/02; B22F 2999/00; B22F 1/14; B22F 3/24; B22F 2003/248; Y02E 60/14; Y02P 20/10; C09K 5/063; C22C 1/0416; C22C 1/05; C22C 29/12; C22C 29/005; C22C 1/051; F28D 20/023; F28D 20/0056; F28F 21/04
See application file for complete search history.

(56) References Cited

U.S. PATENT DOCUMENTS 4,948,766 A * 8/1990 Talmy .................... C04B 35/18
501/86

FOREIGN PATENT DOCUMENTS

CN 101788239 A 7/2010
CN 103361534 A 10/2013

* cited by examiner

*Primary Examiner* — Wayne A Langel
*Assistant Examiner* — Syed T Iqbal
(74) *Attorney, Agent, or Firm* — Element IP, PLC

(57) ABSTRACT

The disclosure relates to a phase change thermal storage ceramic having high service temperature and improved utilization rate and utilization efficiency of heat. It is prepared at a low cost with a simple, easy-to-industrially-realized method. A mixture is obtained by mixing and stirring evenly 50-85 wt % of fused mullite powder, 10-45 wt % of pretreated aluminum-silicon alloy powder, and 3-8 wt % of ball clay. A ceramic body is formed by press molding the mixture at 80-150 MPa. The ceramic body is cured at 25-28° C. and a relative humidity of 70-75 RH for 24-36 h, dried at 80-120° C. for 24-36 h, and held at 1,100-1,300° C. for 3-5 h to prepare the phase change thermal storage ceramic. The pretreated aluminum-silicon alloy powder is prepared by holding aluminum-silicon alloy powder in water vapor at 0.02-0.20 MPa for 0.5-3 h to impregnate in an alkaline silica sol and drying the impregnated powder.

8 Claims, No Drawings

PHASE CHANGE THERMAL STORAGE CERAMIC AND PREPARATION METHOD THEREOF

TECHNICAL FIELD

The present disclosure relates to the technical field of phase change thermal storage materials, and in particular to a phase change thermal storage ceramic and a preparation method thereof.

BACKGROUND

Thermal storage technology is an energy storage technology that uses thermal storage materials to store temporarily unnecessary heat and release the heat when needed. The thermal storage technology solves the time difference between heat supply and demand and improves the utilization of heat. Therefore, the technology can be used for peak load shifting of power load, solar energy reserve, industrial waste heat recovery, etc., so as to achieve the purpose of developing new energy and saving old energy.

The core issue of the thermal storage technology is the preparation and application of thermal storage materials, among which phase change thermal storage materials have become thermal storage materials with development potential due to high energy storage and adjustable phase change temperature thereof. At present, thermal storage ceramics are generally porous thermal storage ceramics that use sensible heat as the thermal storage method. However, the thermal storage capacity of sensible thermal storage ceramics is limited and ceramic temperature fluctuates. Phase change thermal storage materials use the latent heat of the solid-liquid phase change of a material for thermal storage, with small temperature fluctuations. Therefore, adding phase change materials to ceramics and using sensible heat and phase change latent heat for thermal storage comprehensively have become a hot spot in recent years.

In recent years, some scholars have carried out some research on phase change thermal storage ceramics, and have disclosed some phase change thermal storage ceramics containing phase change materials. For example, in a patented technology of "METHOD FOR PREPARING CERAMIC HEAT STORAGE BALL WRAPPED WITH PHASE CHANGE MATERIAL" (CN201010119544.1), SiC powder, feldspar powder, and kaolin as raw materials are directly mixed and pressed to form, and fired at high temperatures to obtain a SiC ceramic spherical shell; then SiC powder and low-temperature frits mixed with polyvinyl alcohol to prepare encapsulant muds; finally, the phase change material is placed in the spherical shell for packaging and sintering. However, the preparation process of this method is complicated, and the encapsulation of the spherical shell is prone to cracking. In a patented technology of "CERMET WITH PHASE CHANGE HEAT STORAGE FUNCTION AND MANUFACTURING METHOD" (CN201310293700.X), with aluminum-silicon alloy powder and corundum powder as raw materials and magnesium oxide as a sintering aid, a cermet with phase change heat storage function is manufactured by dry ball milling, forming and sintering. The above technical method uses the phase change material as a raw material directly in the preparation of a composite phase change thermal storage material, and uses the heat absorption and release of the phase change material during the occurrence of the phase change to achieve the purpose of thermal storage. This hybrid molding method is extremely easy to leak and overflow after the aluminum-silicon alloy powder is melted during the firing process, and liquid-phase aluminum-silicon alloy will also reduce the high-temperature physical properties of the material.

SUMMARY

The present disclosure aims to overcome the defects of the prior art, and aims to provide a method for preparing a phase change thermal storage ceramic with low preparation cost, simple production process and easy industrial production; the prepared phase change thermal storage ceramic can improve the utilization rate and utilization efficiency of heat, and has a high service temperature.

To achieve the above objective, the technical solution adopted by the present disclosure is:

50-85 wt % of fused mullite powder, 10-45 wt % of pretreated aluminum-silicon alloy powder and 3-8 wt % of ball clay are mixed and stirred evenly to obtain a mixture. The mixture is formed by press molding at 80-150 MPa to obtain a ceramic body. The ceramic body is cured in an environment at a temperature of 25-28° C. and a relative humidity of 70-75 RH for 24-36 h, dried at 80-120° C. for 24-36 h, and held at 1,100-1,300° C. for 3-5 h to prepare a phase change thermal storage ceramic.

A preparation method of the pretreated aluminum-silicon alloy powder includes:

step 1: placing the aluminum-silicon alloy powder in an autoclave and holding the powder in water vapor at a pressure of 0.02-0.20 MPa for 0.5-3 h to obtain an aluminum-silicon alloy powder corroded by water vapor;

step 2: placing the aluminum-silicon alloy powder corroded by water vapor in an alkaline silica sol (pH 8-12), holding for 10-30 h, and filtering to obtain an impregnated aluminum-silicon alloy powder; and step 3: placing the impregnated aluminum-silicon alloy powder in an oven at 50-110° C. and drying the powder for 12-24 h to obtain a pretreated aluminum-silicon alloy powder.

Nanoparticles in the alkaline silica sol may be 10-20 nm in particle size.

Chemical composition and content of the fused mullite powder may be: 68-73 wt % $Al_2O_3$ and 22-25 wt % $SiO_2$; the fused mullite powder may be <58 μm in particle size.

Chemical composition and content of the ball clay may be: 17-35 wt % $Al_2O_3$ and $SiO_2$ 45-74 wt %; the ball clay may be <45 μm in particle size.

Silicon (Si) content of the aluminum-silicon alloy powder may be 1-44 wt %, and the aluminum-silicon alloy powder may be <74 μm in particle size.

Due to the adoption of the above technical solution, the present disclosure has the following positive effects compared with the prior art:

The present disclosure uses mullite powder, pretreated aluminum-silicon alloy powder and ball clay as raw materials, and has a low preparation cost; the raw materials are mixed, formed by press molding, cured, dried, and fired at 1,100-1,300° C. to obtain a phase change thermal storage ceramic. The production process is simple and industrial production is easy to realize.

The aluminum-silicon alloy used in the present disclosure easily reacts with water vapor to produce aluminum hydroxide; disperse distribution of aluminum and silicon in the aluminum-silicon alloy prevents the aluminum hydroxide produced by the reaction from forming a dense film and hindering the further progress of the reaction. Therefore, after the aluminum-silicon alloy is placed in water vapor for a period of time, the aluminum hydroxide with adsorption will form on the surface. When these surface-treated aluminum-silicon alloy powders are placed in silica sol, the nano-silica in the silica sol will be adsorbed in a vacuum environment to form an initial shell layer of silica sol+aluminum hydroxide. This kind of ceramic initial shell makes it easy to mix the pretreated aluminum-silicon alloy powder with the mullite powder and the ball clay evenly. At a high temperature, the silica in the silica sol binds to the part of alumina formed by the decomposition of aluminum hydroxide. A mullite shell layer is formed, wrapped on the surface of the aluminum-silicon alloy powder, and sintered with the mullite in the raw material to form a ceramic skeleton. The prepared phase change thermal storage ceramic can use both the phase change latent heat of the aluminum-silicon alloy and the sensible heat of the ceramic skeleton, with high utilization rate and utilization efficiency of heat. This can meet the requirements of solar power plants, high-temperature heat exchange of industrial furnaces, and heat recovery of high-temperature industrial waste gases.

The phase change thermal storage ceramic prepared by the present disclosure solves the problem that the aluminum-silicon alloy is not easily mixed with ceramic powders directly, and effectively utilizes the phase change latent heat of the aluminum-silicon alloy. Because of the advantages of high strength, high temperature resistance, and cold and heat cycle resistance, the prepared phase change thermal storage ceramic can effectively prevent the melting loss of the aluminum-silicon alloy in the molten state and the resulting decrease in the latent heat of the phase change thermal storage ceramic, with high service temperature and high utilization efficiency of heat.

The phase change thermal storage ceramic prepared in this embodiment has been tested: the apparent porosity is 31.5-34.0%; the bulk density was 2.13-2.34 g/cm$^3$; the cold crushing strength was 50-120 MPa; the cold modulus of rupture was 10-45 MPa; the phase change latent heat was 90-200 J/g; the thermal conductivity was 3-25 W·m$^{-1}$·K$^{-1}$.

Therefore, the preparation cost of the present disclosure is low, the production process is simple, and industrial production is easy to realize; the prepared phase change thermal storage ceramic can improve the utilization rate and utilization efficiency of heat, and has a high service temperature.

DETAILED DESCRIPTION

The present invention will be further described in detail below in combination with embodiments, and these embodiments are not meant to limit the scope of the present disclosure.

In order to avoid repetition, the materials involved in this specific implementation are described in a unified manner as follows, which will not be repeated in the embodiments:

Chemical composition and content of the fused mullite powder may be: 68-73 wt % $Al_2O_3$ and 22-25 wt % $SiO_2$; the fused mullite powder may be <58 μm in particle size.

Chemical composition and content of the ball clay may be: 17-35 wt % $Al_2O_3$ and $SiO_2$ 45-74 wt %; the ball clay may be <45 μm in particle size.

Silicon (Si) content of the aluminum-silicon alloy powder may be 1-44 wt %, and the aluminum-silicon alloy powder may be <74 μm in particle size.

Nanoparticles in the alkaline silica sol may be 10-20 nm in particle size.

Embodiment 1

Disclosed are a phase change thermal storage ceramic and a preparation method thereof. The preparation method of the embodiment was as follows:

50 wt % of fused mullite powder, 45 wt % of pretreated aluminum-silicon alloy powder and 5 wt % of ball clay were mixed and stirred evenly to obtain a mixture. The mixture was formed by press molding at 150 MPa to obtain a ceramic body. The ceramic body was cured in an environment at a temperature of 25° C. and a relative humidity of 70 RH for 30 h, dried at 100° C. for 30 h, and held at 1,200° C. for 4 h to prepare a phase change thermal storage ceramic.

A preparation method of the pretreated aluminum-silicon alloy powder included as follows:

Step 1: the aluminum-silicon alloy powder was placed in an autoclave and held in water vapor at a pressure of 0.2 MPa for 0.5 h to obtain an aluminum-silicon alloy powder corroded by water vapor.

Step 2: the aluminum-silicon alloy powder corroded by water vapor was placed in an alkaline silica sol (pH 8), held for 10 h, and filtered to obtain an impregnated aluminum-silicon alloy powder.

Step 3: the impregnated aluminum-silicon alloy powder was placed in an oven at 50° C. and dried for 24 h to obtain a pretreated aluminum-silicon alloy powder.

The phase change thermal storage ceramic prepared in this embodiment was tested: the apparent porosity was 32.9%; the bulk density was 2.13 g/cm$^3$; the cold crushing strength was 120 MPa; the cold modulus of rupture was 45 MPa; the phase change latent heat was 200 J/g; the thermal conductivity was 25 W·m$^{-1}$·K$^{-1}$.

Embodiment 2

Disclosed are a phase change thermal storage ceramic and a preparation method thereof. The preparation method of the embodiment was as follows:

60 wt % of fused mullite powder, 37 wt % of pretreated aluminum-silicon alloy powder and 3 wt % of ball clay were mixed and stirred evenly to obtain a mixture. The mixture was formed by press molding at 120 MPa to obtain a ceramic body. The ceramic body was cured in an environment at a temperature of 26° C. and a relative humidity of 71 RH for 24 h, dried at 80° C. for 36 h, and held at 1,300° C. for 3 h to prepare a phase change thermal storage ceramic.

A preparation method of the pretreated aluminum-silicon alloy powder included as follows:

Step 1: the aluminum-silicon alloy powder was placed in an autoclave and held in water vapor at a pressure of 0.15 MPa for 1.0 h to obtain an aluminum-silicon alloy powder corroded by water vapor.

Step 2: the aluminum-silicon alloy powder corroded by water vapor was placed in an alkaline silica sol (pH 9), held for 20 h, and filtered to obtain an impregnated aluminum-silicon alloy powder.

Step 3: the impregnated aluminum-silicon alloy powder was placed in an oven at 70° C. and dried for 20 h to obtain a pretreated aluminum-silicon alloy powder.

The phase change thermal storage ceramic prepared in this embodiment was tested: the apparent porosity was 32.3%; the bulk density was 2.20 g/cm$^3$; the cold crushing strength was 102 MPa; the cold modulus of rupture was 37

MPa; the phase change latent heat was 165 J/g; the thermal conductivity was 18 $W \cdot m^{-1} \cdot K^{-1}$.

Embodiment 3

Disclosed are a phase change thermal storage ceramic and a preparation method thereof. The preparation method of the embodiment was as follows:

70 wt % of fused mullite powder, 22 wt % of pretreated aluminum-silicon alloy powder and 8 wt % of ball clay were mixed and stirred evenly to obtain a mixture. The mixture was formed by press molding at 80 MPa to obtain a ceramic body. The ceramic body was cured in an environment at a temperature of 27° C. and a relative humidity of 73 RH for 36 h, dried at 120° C. for 24 h, and held at 1,100° C. for 5 h to prepare a phase change thermal storage ceramic.

A preparation method of the pretreated aluminum-silicon alloy powder included as follows:

Step 1: the aluminum-silicon alloy powder was placed in an autoclave and held in water vapor at a pressure of 0.1 MPa for 1.5 h to obtain an aluminum-silicon alloy powder corroded by water vapor.

Step 2: the aluminum-silicon alloy powder corroded by water vapor was placed in an alkaline silica sol (pH 10), held for 30 h, and filtered to obtain an impregnated aluminum-silicon alloy powder.

Step 3: the impregnated aluminum-silicon alloy powder was placed in an oven at 90° C. and dried for 18 h to obtain a pretreated aluminum-silicon alloy powder.

The phase change thermal storage ceramic prepared in this embodiment was tested: the apparent porosity was 31.5%; the bulk density was 2.26 $g/cm^3$; the cold crushing strength was 83 MPa; the cold modulus of rupture was 31 MPa; the phase change latent heat was 142 J/g; the thermal conductivity was 10 $W \cdot m^{-1} \cdot K^{-1}$.

Embodiment 4

Disclosed are a phase change thermal storage ceramic and a preparation method thereof. The preparation method of the embodiment was as follows:

78 wt % of fused mullite powder, 15 wt % of pretreated aluminum-silicon alloy powder and 7 wt % of ball clay were mixed and stirred evenly to obtain a mixture. The mixture was formed by press molding at 120 MPa to obtain a ceramic body. The ceramic body was cured in an environment at a temperature of 28° C. and a relative humidity of 75 RH for 30 h, dried at 100° C. for 30 h, and held at 1,200° C. for 5 h to prepare a phase change thermal storage ceramic.

A preparation method of the pretreated aluminum-silicon alloy powder included as follows:

Step 1: the aluminum-silicon alloy powder was placed in an autoclave and held in water vapor at a pressure of 0.05 MPa for 2.0 h to obtain an aluminum-silicon alloy powder corroded by water vapor.

Step 2: the aluminum-silicon alloy powder corroded by water vapor was placed in an alkaline silica sol (pH 11), held for 30 h, and filtered to obtain an impregnated aluminum-silicon alloy powder.

Step 3: the impregnated aluminum-silicon alloy powder was placed in an oven at 100° C. and dried for 16 h to obtain a pretreated aluminum-silicon alloy powder.

The phase change thermal storage ceramic prepared in this embodiment was tested: the apparent porosity was 33.6%; the bulk density was 2.31 $g/cm^3$; the cold crushing strength was 62 MPa; the cold modulus of rupture was 21 MPa; the phase change latent heat was 119 J/g; the thermal conductivity was 5 $W \cdot m^{-1} \cdot K^{-1}$.

Embodiment 5

Disclosed are a phase change thermal storage ceramic and a preparation method thereof. The preparation method of the embodiment was as follows:

85 wt % of fused mullite powder, 10 wt % of pretreated aluminum-silicon alloy powder and 5 wt % of ball clay were mixed and stirred evenly to obtain a mixture. The mixture was formed by press molding at 150 MPa to obtain a ceramic body. The ceramic body was cured in an environment at a temperature of 26° C. and a relative humidity of 72 RH for 24 h, dried at 80° C. for 36 h, and held at 1,250° C. for 4 h to prepare a phase change thermal storage ceramic.

A preparation method of the pretreated aluminum-silicon alloy powder included as follows:

Step 1: the aluminum-silicon alloy powder was placed in an autoclave and held in water vapor at a pressure of 0.02 MPa for 3 h to obtain an aluminum-silicon alloy powder corroded by water vapor.

Step 2: the aluminum-silicon alloy powder corroded by water vapor was placed in an alkaline silica sol (pH 12), held for 30 h, and filtered to obtain an impregnated aluminum-silicon alloy powder.

Step 3: the impregnated aluminum-silicon alloy powder was placed in an oven at 110° C. and dried for 12 h to obtain a pretreated aluminum-silicon alloy powder.

The phase change thermal storage ceramic prepared in this embodiment was tested: the apparent porosity was 34.0%; the bulk density was 2.34 $g/cm^3$; the cold crushing strength was 50 MPa; the cold modulus of rupture was 10 MPa; the phase change latent heat was 90 J/g; the thermal conductivity was 3 $W \cdot m^{-1} \cdot K^{-1}$.

This specific implementation has the following positive effects compared with the prior art:

This specific implementation uses mullite powder, pretreated aluminum-silicon alloy powder and ball clay as raw materials, and has a low preparation cost; the raw materials are mixed, formed by press molding, cured, dried, and fired at 1,100-1,300° C. to obtain a phase change thermal storage ceramic. The production process is simple and industrial production is easy to realize.

The aluminum-silicon alloy used in the specific implementation easily reacts with water vapor to produce aluminum hydroxide; disperse distribution of aluminum and silicon in the aluminum-silicon alloy prevents the aluminum hydroxide produced by the reaction from forming a dense film and hindering the further progress of the reaction. Therefore, after the aluminum-silicon alloy is placed in water vapor for a period of time, the aluminum hydroxide with adsorption will form on the surface. When these surface-treated aluminum-silicon alloy powders are placed in silica sol, the nano-silica in the silica sol will be adsorbed in a vacuum environment to form an initial shell layer of silica sol+aluminum hydroxide. This kind of ceramic initial shell makes it easy to mix the pretreated aluminum-silicon alloy powder with the mullite powder and the ball clay evenly. At a high temperature, the silica in the silica sol binds to the part of alumina formed by the decomposition of aluminum hydroxide. A mullite shell layer is formed, wrapped on the surface of the aluminum-silicon alloy powder, and sintered with the mullite in the raw material to form a ceramic skeleton. The prepared phase change thermal storage ceramic can use both the phase change latent heat of the aluminum-silicon alloy and the sensible heat of the ceramic skeleton, with high utilization rate and utilization efficiency of heat. This can meet the requirements of solar power plants, high-temperature heat exchange of industrial furnaces, and heat recovery of high-temperature industrial waste gases.

The phase change thermal storage ceramic prepared by the specific implementation solves the problem that the aluminum-silicon alloy is not easily mixed with ceramic powders directly, and effectively utilizes the phase change latent heat of the aluminum-silicon alloy. Because of the advantages of high strength, high temperature resistance, and cold and heat cycle resistance, the prepared phase change thermal storage ceramic can effectively prevent the melting loss of the aluminum-silicon alloy in the molten state and the resulting decrease in the latent heat of the phase change thermal storage ceramic, with high service temperature and high utilization efficiency of heat.

The phase change thermal storage ceramic prepared in the specific implementation has been tested: the apparent porosity is 31.5-34.0%; the bulk density was 2.13-2.34 g/cm$^3$; the cold crushing strength was 50-120 MPa; the cold modulus of rupture was 10-45 MPa; the phase change latent heat was 90-200 J/g; the thermal conductivity was 3-25 W·m$^{-1}$·K$^{-1}$.

Therefore, the preparation cost of the specific implementation is low, the production process is simple, and industrial production is easy to realize; the prepared phase change thermal storage ceramic can improve the utilization rate and utilization efficiency of heat, and has a high service temperature.

What is claimed is:

1. A method for preparing a phase change thermal storage ceramic, the method comprising:

mixing and stirring evenly 50-85 wt % of fused mullite powder, 10-45 wt % of pretreated aluminum-silicon alloy powder, and 3-8 wt % of ball clay to obtain a mixture;

press molding the mixture at 80-150 MPa to obtain a ceramic body; and preparing the phase change thermal storage ceramic by curing the ceramic body at a temperature of 25-28° C. and a relative humidity of 70-75 RH for 24-36 h, drying the ceramic body at 80-120° C. for 24-36 h, and holding the ceramic body at 1,100-1,300° C. for 3-5 h;

wherein the pretreated aluminum-silicon alloy powder is prepared by a method comprising:

placing aluminum-silicon alloy powder in an autoclave and holding the powder in water vapor at a pressure of 0.02-0.20 MPa for 0.5-3 h to obtain an aluminum-silicon alloy powder corroded by water vapor;

placing the aluminum-silicon alloy powder corroded by water vapor in an alkaline silica sol having a pH of 8-12 and containing nanoparticles with a particle size of 10-20 nm, holding for 10-30 h, and filtering to obtain an impregnated aluminum-silicon alloy powder; and placing the impregnated aluminum-silicon alloy powder in an oven at 50-110° C. and drying the powder for 12-24 h to obtain the pretreated aluminum-silicon alloy powder.

2. The method according to claim 1, wherein the fused mullite powder comprises: 68-73 wt % $Al_2O_3$ and 22-25 wt % $SiO_2$; and the fused mullite powder has a particle size of <58 μm.

3. The method according to claim 1, wherein the ball clay comprises: 17-35 wt % $Al_2O_3$ and 45-74 wt % $SiO_2$; and the ball clay has a particle size of <45 μm.

4. The method according to claim 1, wherein the aluminum-silicon alloy powder contains 1-44 wt % of silicon, and the aluminum-silicon alloy powder has a particle size of <74 μm.

5. A phase change thermal storage ceramic, which is prepared by the method according to claim 1.

6. A phase change thermal storage ceramic, which is prepared by the method according to claim 2.

7. A phase change thermal storage ceramic, which is prepared by the method according to claim 3.

8. A phase change thermal storage ceramic, which is prepared by the method according to claim 4.

* * * * *